(12) United States Patent
McTigue et al.

(10) Patent No.: US 6,704,673 B2
(45) Date of Patent: Mar. 9, 2004

(54) SYSTEM AND METHOD FOR IMPROVING LINEARITY AND REDUCING DIGITIZATION ARTIFACTS IN A DATA ANALYSIS SYSTEM

(75) Inventors: Michael T. McTigue, Colorado Springs, CO (US); Allen Montijo, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 77 days.

(21) Appl. No.: 10/212,908

(22) Filed: Aug. 6, 2002

(65) Prior Publication Data

US 2004/0030518 A1 Feb. 12, 2004

(51) Int. Cl.$^7$ .............................. H03M 1/10; H03M 1/20
(52) U.S. Cl. ......................... 702/107; 341/120; 341/131
(58) Field of Search .......................... 702/107; 341/118, 341/120, 131, 126, 94, 155, 156

(56) References Cited

U.S. PATENT DOCUMENTS

| | | | | |
|---|---|---|---|---|
| 6,166,595 A | * | 12/2000 | Moldsvar et al. | 330/9 |
| 6,268,814 B1 | * | 7/2001 | Kolsrud | 341/131 |
| 6,476,741 B1 | * | 11/2002 | Cherubal et al. | 341/120 |
| 6,515,611 B1 | * | 2/2003 | Fetterman et al. | 341/161 |
| 6,518,899 B2 | * | 2/2003 | Yu | 341/118 |
| 2002/0030615 A1 | * | 3/2002 | Cherubal et al. | 341/120 |
| 2002/0041247 A1 | * | 4/2002 | Steensgaard-Madsen | 341/156 |

OTHER PUBLICATIONS

Dent et al., "Linearization of Analog-to-Digital Converters", IEEE, 1990.*

* cited by examiner

Primary Examiner—Patrick Assouad

(57) ABSTRACT

A system and method for improving linearity of data outputted from an analog-to-digital converter and reducing digitization artifacts, is provided. A noise generator is provided for generating noise and adding the noise to at least one code word that is introduced to the system, wherein the at least one code word comprises a unitary portion and a fractional portion, the noise being added to the fractional portion of the at least one code word. A storage device is also located within the system for storing the at least one code word, and a high threshold and a low threshold for each of the at least one code word. The storage device is capable of outputting the high threshold and the low threshold of the at least one code word as a result of receiving the unitary portion of the at least one code word, wherein the low threshold and the high threshold, in combination with the fractional portion, are utilized to derive linear digital data having a uniform resolution.

20 Claims, 6 Drawing Sheets

SYSTEM AND METHOD FOR IMPROVING LINEARITY AND REDUCING DIGITIZATION ARTIFACTS IN A DATA ANALYSIS SYSTEM

FIELD OF THE INVENTION

The present invention generally relates to data analysis and, more particularly, is related to a system and method for improving linearity and reducing digitization artifacts in data analysis systems.

BACKGROUND OF THE INVENTION

With advancements in technology, new data analysis systems are continuously being introduced to improve data accuracy and/or quality prior to data use. Examples of data analysis systems include, among others, oscilloscopes, spectrum analyzers and network analyzers.

Linearity of internal components is of particular importance to data analysis systems to ensure that analysis is performed on accurate data. Typical data analysis systems amplify and/or convert received data prior to use. Typically, the amplification and/or conversion is performed within an analog portion of the data analysis system. Non-linearities may be introduced to data during amplification and/or conversion. The non-linearities may be attributed to many different sources. As an example, non-linearity may be added to data signals during conversion from an analog signal to a digital signal by an analog-to-digital converter (ADC). Introduction of non-linearities to data signals by the ADC may result in data degradation.

Non-linearities introduced by the ADC may be attributed to noise within the ADC, process variation and inconsistencies, or any of multiple other conditions. A first example of non-linearity is integral non-linearity, which is characterized by a transfer curve of the ADC varying from an ideal transfer curve, on the macro level. A second example of non-linearity is differential non-linearity, which is characterized by a transfer curve of the ADC varying from an ideal transfer curve, on the micro level.

FIG. 1A and FIG. 1B are graphs of transfer functions associated with an 8-bit ADC. In FIG. 1A and FIG. 1B, the x-axis of each of the graphs represents input voltage values, while the y-axis of each of the graphs represents outputted code words. Ideally, the 8-bit ADC has two hundred and fifty six (256) codes that are evenly spaced, as illustrated by the plot of the ideal transfer function shown in FIG. 1A.

FIG. 1B is a graph of the transfer function of FIG. 1A, wherein integral non-linearity has been introduced by the ADC. As shown by FIG. 1B, the actual ADC transfer curve 10 varies from the ideal ADC transfer curve 20. The difference between the actual ADC transfer curve 10 and the ideal ADC transfer curve 20, namely, the integral linear error, indicates that a large accuracy error has been introduced by the non-linearity.

Displaying and/or representing data by a data analysis system, after degradation by the ADC, such as via plotting transfer functions, illustrates non-linearity attributed to the ADC. Digital code words representing outputs of the ADC are typically plotted on a display to allow a user of the data analysis system to view the ADC output.

Non-uniform resolution of the output may result in a display of the digital code words having gaps or steps, otherwise known in the art as digitization artifacts, between plotted points that represent outputs of the ADC. Non-uniform resolution of the output may also be attributed to a non-uniform input to the ADC. It is desirable to correct for non-linearities attributed by the ADC prior to use and/or display of data outputted by the ADC, thereby resulting in a uniform resolution of code words displayed by the data analysis system.

SUMMARY OF THE INVENTION

In light of the foregoing, the present invention generally relates to a system for improving linearity of data outputted from an analog-to-digital converter and reducing digitization artifacts. Generally, the system utilizes a noise generator for generating noise and adding the noise to at least one code word that is introduced to the system, wherein the at least one code word comprises a unitary portion and a fractional portion, the noise being added to the fractional portion of the at least one code word. A storage device is also located within the system for storing the at least one code word, and a high threshold and a low threshold for each of the at least one code word. The storage device is capable of outputting the high threshold and the low threshold of the at least one code word as a result of receiving the unitary portion of the at least one code word, wherein the low threshold and the high threshold, in combination with the fractional portion, are utilized to derive linear digital data having a uniform resolution.

The present invention can also be viewed as providing a method for improving linearity of data outputted from an analog-to-digital converter and reducing digitization artifacts. In this regard, during a normal mode, the method can be broadly summarized by the following steps: adding noise to a code word outputted from an analog-to-digital converter, wherein the code word comprises a unitary portion and a fractional portion, the noise being added to the fractional portion of the code word; determining a low threshold and a high threshold via use of the unitary portion of the code word; and utilizing the low threshold and the high threshold, in combination with the fractional portion, to derive linear digital data having a uniform resolution.

Alternatively, during a high-resolution mode, the method can be broadly summarized by the following steps: averaging a series of code words outputted from an analog-to-digital converter, resulting in an averaged code word having a unitary portion and a fractional portion; adding a noise portion to the fractional portion of the averaged code word; determining a low threshold and a high threshold via use of the unitary portion of the averaged code word; and utilizing the low threshold and the high threshold, in combination with the fractional portion, to derive linear digital data having a uniform resolution.

Other systems and methods of the present invention will be or become apparent to one having ordinary skill in the art upon examination of the following drawings and detailed description. It is intended that all such additional systems, methods and advantages be included within this description, be within the scope of the present invention, and be protected by the accompanying claims.

BRIEF DESCRIPTION OF THE DRAWINGS

The invention can be better understood with reference to the following drawings. The components of the drawings are not necessarily to scale, emphasis instead being placed upon clearly illustrating the principles of the present invention. Moreover, in the drawings, like referenced numerals designate corresponding parts throughout the several views.

DETAILED DESCRIPTION

The present non-linearity correction and digitized artifact reducing system removes non-linearity contributed by an ADC and ensures that a display of data sampled from an output of the ADC has a distribution that is similar to distribution of an original signal provided to the ADC. The non-linearity correction and digitized artifact reducing system may be provided within any device and/or system having an analog-to-digital converter (ADC). As an example, the non-linearity correction and digitized artifact reducing system may be provided within electronic test and measurement equipment, a transmitter located within a cellular phone, a modem, or an optical telecommunication system. For exemplary purposes, the following describes the non-linearity correction and uniform distribution system as being located within a digital oscilloscope.

Figure 2:
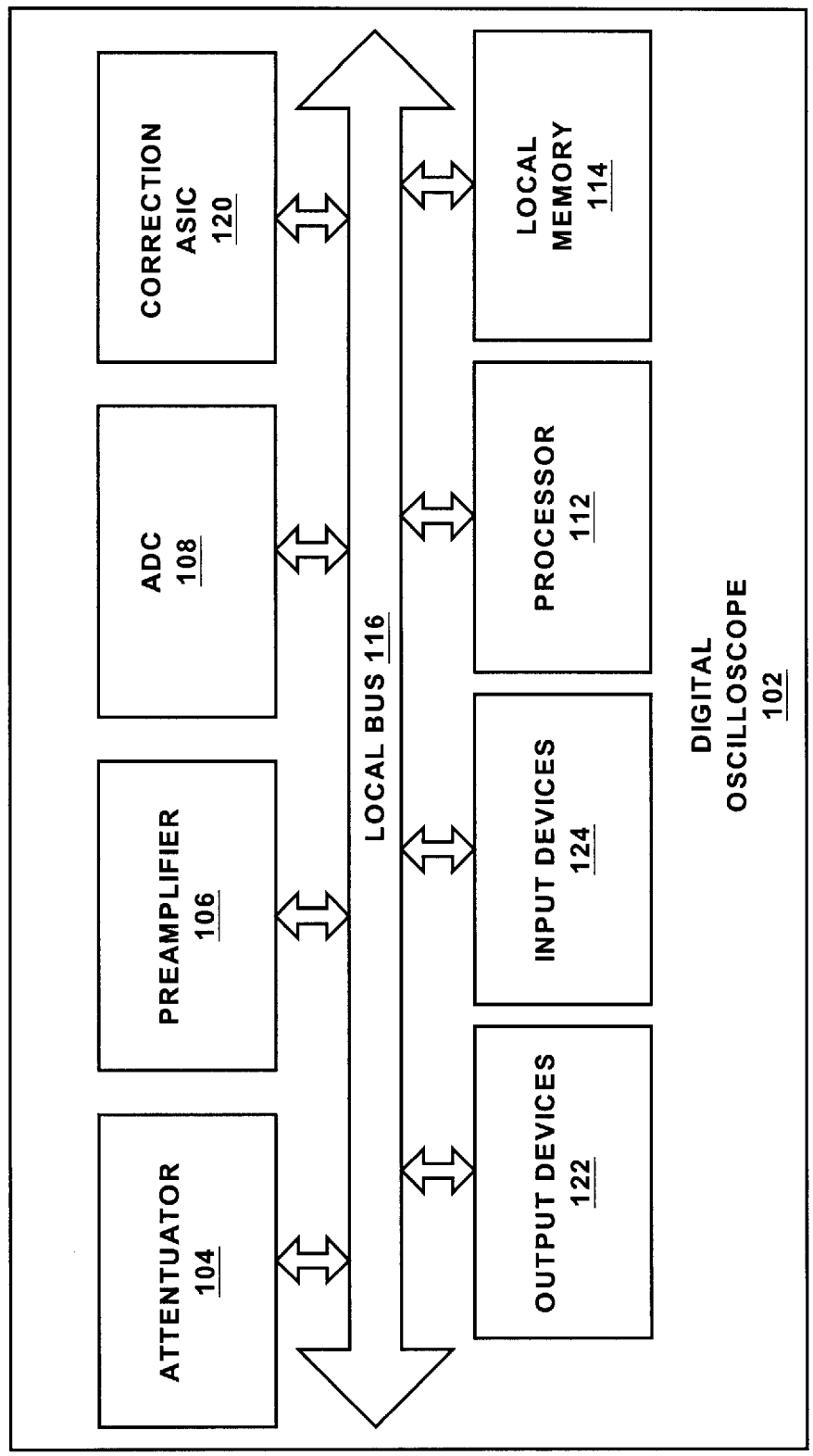
FIG. 2 is a block diagram illustrating a digital oscilloscope.

Referring now to the drawings, wherein like reference numerals designate corresponding parts throughout the drawings, FIG. 2 is a block diagram illustrating an example of a digital oscilloscope 102 in which the present non-linearity correction and uniform distribution system is provided. In accordance with the first exemplary embodiment of the invention, the non-linearity correction and digitized artifact reducing system is located on an application specific integrated circuit (ASIC), referred to herein as a correction ASIC 120. The correction ASIC 120 is located within the digital oscilloscope 102 and is described in detail below. It should be noted, however, that the present non-linearity correction and uniform distribution system may alternatively be provided on a device other than an ASIC.

An analog signal may be introduced to the digital oscilloscope 102 from a data signal source (not shown). Different data signal sources may provide the analog signal, such as, but not limited to, an integrated circuit or a transmitter. As shown by FIG. 2, an attenuator 104 is located within the digital oscilloscope 102. The attenuator 104 reduces power or amplitude of the received analog signal to a level that is within an input range of an ADC 108 located within the correction ASIC 120.

A pre-amplifier 106 increases gain of the analog signal to a level within the input range of the ADC 108. The combination of the attenuator 104 and the pre-amplifier 106 ensures that the analog signal is within the input range of the ADC 108 prior to introduction of the analog signal to the ADC 108.

The ADC 108 may be located within the correction ASIC 120 for converting the analog signal into a digital signal. As is known by those having ordinary skill in the art, conversion from an analog signal to a digital signal typically occurs in two steps. In the first step, the analog signal is sampled at periodic points in time. In the second step, a code word is assigned to represent the approximate voltage value of each sample, wherein the code word typically is represented by binary symbols that correspond to a voltage range. Therefore, each sample value is converted into a code word, which, in turn, can be represented by the digital oscilloscope 102 as a point within a digital waveform comprising multiple joined points. Each of the code words may be stored within a local memory 114 for use by the correction ASIC 120, as is disclosed below.

As is known by those having ordinary skill in the art, ADCs have multiple thresholds. As an example, while an 8-bit ADC has two hundred and fifty-six outputted code words (i.e., $2^8$), the ADC has two hundred and fifty-five thresholds. However, interpreting the two hundred and fifty-six outputted code words requires two hundred and fifty-seven stored thresholds. Two hundred and fifty-seven thresholds are required so that each code word has a threshold above and below the code word to enable a look-up of low and high thresholds for the code word. Values stored for the low threshold for the lowest code word and the high threshold for the highest code word are referred to as "virtual" thresholds that the user may select to provide a desired result. As an example, the high threshold for the highest code word can be selected to be one nominal code word above the low threshold for the code word. The look-up process is described in detail below. As an example, the calibrated low threshold for code word "43" is a voltage at which the ADC 108 switches from outputting code word "42" to outputting code word "43." Alternatively, the calibrated low threshold may be when 50% of the code words are code word "42" or less and 50% are code word "43" or above. Similarly, the calibrated high threshold for code word "43" is the voltage at which the ADC 108 switches from outputting code word "43" to outputting code word "44."

As mentioned above, the ADC 108 may introduce non-linearity to a received analog signal during conversion of the analog signal to a digital signal. Unfortunately, even though it is desirable to have equal spacing between thresholds to ensure that a display of outputted code words has uniform resolution, non-linearity introduced by the ADC 108 may prevent equal spacing between thresholds, and therefore prevent a uniform resolution.

While, in accordance with the first exemplary embodiment of the invention, the correction ASIC 120 addresses and compensates for non-linearities and provides a uniform resolution of outputted code words associated with the ADC 108, the correction ASIC 120 may be utilized to compensate and provide for other categories of amplification and/or conversion logic.

Calibration of the ADC 108 enables a determination of ADC 108 thresholds. As is known by those having ordinary skill in the art, there are many different methods that may be used to calibrate the ADC 108. The following provides an example of one method of calibrating the ADC 108. Calibration may be performed by a processor 112 located within the digital oscilloscope 102. Specifically, to determine thresholds of the ADC 108, an input voltage to the ADC 108 is slightly increased or decreased while code word outputs from the ADC 108 are monitored by the processor 112. As an example, a ramp may be applied to the input of the ADC 108 and a series of digital samples (i.e., code words) are taken from the digital output of the ADC 108. The output code words of the ADC 108 are monitored to enable a determination of a specific threshold between each two sequentially consecutive code words. Repeating modification of the input voltage and monitoring output code words enables determination of other thresholds of the ADC 108. Since the calibration of an ADC is well known by those of ordinary skill in the art, further discussion of the calibration procedure is not provided herein. Non-linearity of the ADC 108 may cause thresholds of the ADC 108 to be offset from intended thresholds of the ADC 108.

The determined threshold values for the ADC 108 are stored and utilized by the correction ASIC 120 as described below. Specifically, a threshold look-through device 122 (FIG. 3) located within the correction ASIC 120 stores thresholds and code words that have been previously stored within the local memory 114, as is further described below with reference to FIG. 3. It should be noted that the local memory 114 can be, or include, any one or combination of volatile memory elements (e.g., random access memory (RAM), such as dynamic RAM (DRAM), static RAM (SRAM), synchronous DRAM (SDRAM), etc.) and non-volatile memory elements (e.g., read only memory (ROM), hard drive, tape, compact disc, ROM (CDROM), etc.). Moreover, the local memory 114 may incorporate electronic, magnetic, optical, and/or other types of storage media. Note that the local memory 114 can have a distributed architecture, where various components are situated remote from one another, but can be accessed directly or indirectly by the processor 112.

It should be noted that communication between the attenuator 104, preamplifier 106, local memory 114, the processor 112, the ADC 108 and the correction ASIC 120 may be provided by a local bus 116, or a dedicated path. Alternatively, the ADC 108 may also have a direct connection to the correction ASIC 120. It should also be noted that functionality provided within the correction ASIC 120 may be entirely or partially implemented with any or a combination of the following alternative technologies, which are each well known in the art: a discrete logic circuit(s) having logic gates for implementing logic functions upon data signals, a programmable gate array(s) (PGA), a field programmable gate array (FPGA), a full custom integrated circuit, etc.

In addition, while the present detailed description provides the non-linearity correction and digitized artifact reducing within a correction ASIC 120, functionality performed by the correction ASIC 120 may be provided completely or partially via software. In accordance with a second exemplary embodiment of the invention, where the system is provided via software, the system can be stored on any computer readable medium for use by or in connection with any computer related system or method. In the context of this document, a computer readable medium is an electronic, magnetic, optical, or other physical device or means that can contain or store a computer program for use by or in connection with a computer related system or method.

In accordance with the second exemplary embodiment of the invention, the system can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The correction ASIC 120 corrects non-linearity of the received data signal caused by the ADC 108 by utilizing output code words received from the output of the ADC 108 and thresholds of the ADC 108. A detailed discussion of the correction ASIC 120 and use of code words and thresholds is provided below with reference to FIG. 3 and FIG. 4. In addition, the correction ASIC 120 compensates for any non-uniform resolution of outputted code words by introducing noise to the outputted code words, otherwise referred to as dithering. Compensation for non-uniform resolution is also described in detail with reference to FIG. 3 and FIG. 4.

The digital oscilloscope 102 communicates with at least one output device 123 for presenting data signal properties after a conversion from an analog signal to digital signal. In addition, the digital oscilloscope 102 communicates with at least one input device 124 for controlling functionality of the digital oscilloscope 102. Examples of output devices 123 may include, but are not limited to, a monitor and a printer. Examples of input devices 124 may include, but are not limited to, a keyboard and a mouse for specifying commands to the digital oscilloscope 102.

Figure 3:
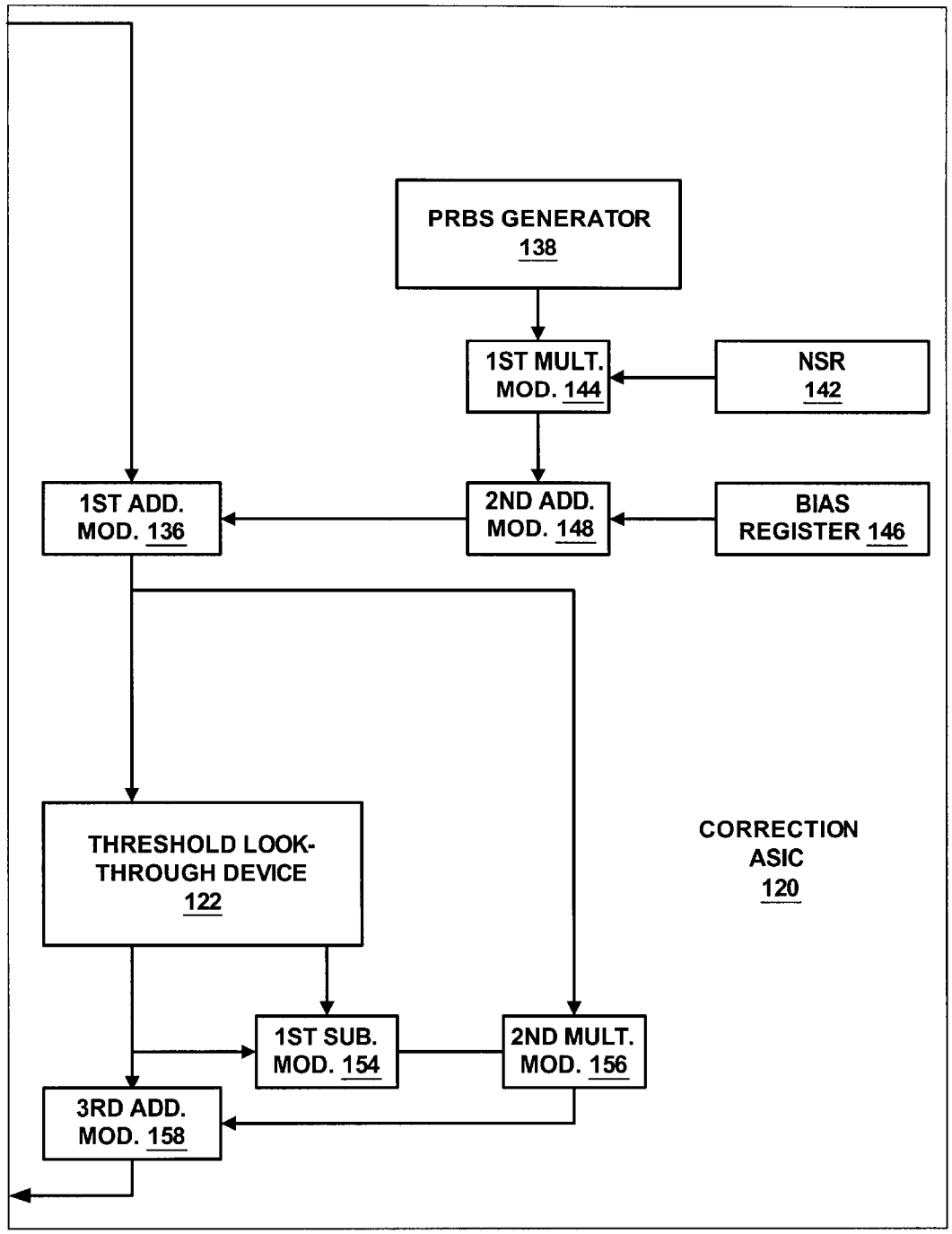
FIG. 3 is a block diagram that further illustrates the correction application specific integrated circuit of FIG. 2 located within the digital oscilloscope of FIG. 2.

FIG. 3 is a block diagram that further illustrates the correction ASIC 120 of FIG. 2. The correction ASIC 120 comprises a threshold look-through device 122. The threshold look-through device 122 is preferably a dual port RAM, although other categories of memory elements (i.e., single port, volatile and non-volatile) may instead be utilized. Code words and their previously determined threshold values are stored in a table located within the threshold look-through device 122. Alternatively, the code word may be a reference point that directly addresses a low threshold, thereby not requiring the code word to be stored. In addition, only high thresholds may be stored, wherein a low threshold is the high threshold of the next lower code word, or only low thresholds may be stored, wherein a high threshold is the low threshold of the next higher code word. Further illustration of the threshold look-through device 122 is provided by FIG. 4, which is described immediately below, prior to further description of the correction ASIC 120 illustrated by FIG. 3.

Figure 1A:
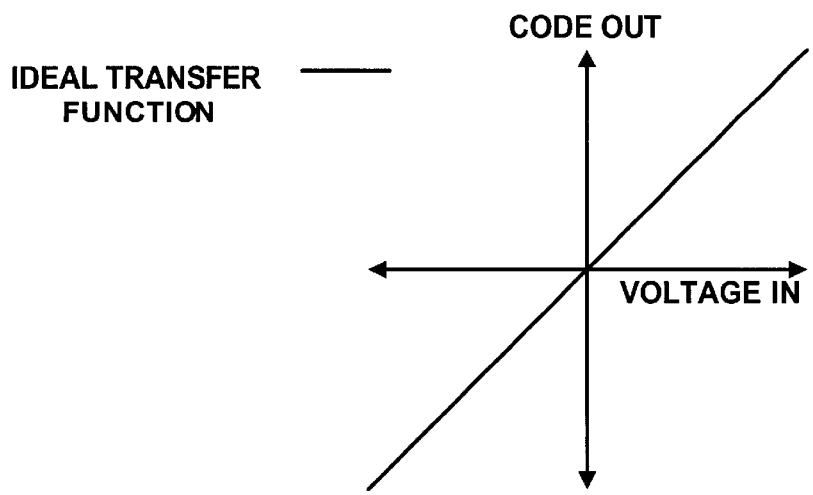
FIG. 1A is a schematic diagram providing a graph of a transfer function of an eight bit analog-to-digital converter.
Figure 1B:
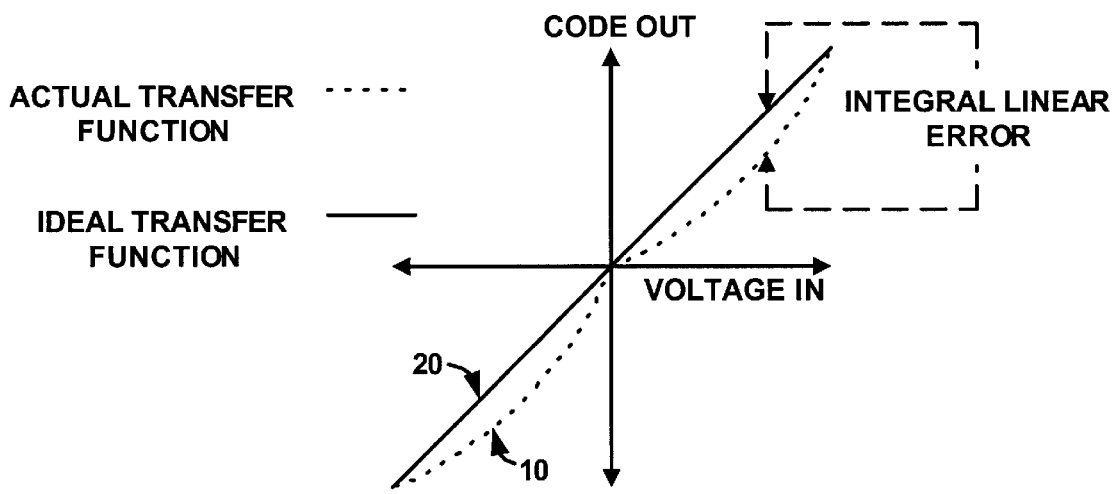
FIG. 1B is a schematic diagram providing the graph illustrated by FIG. 1A, wherein integral non-linearity has been introduced by the analog-to-digital converter.
Figure 4:
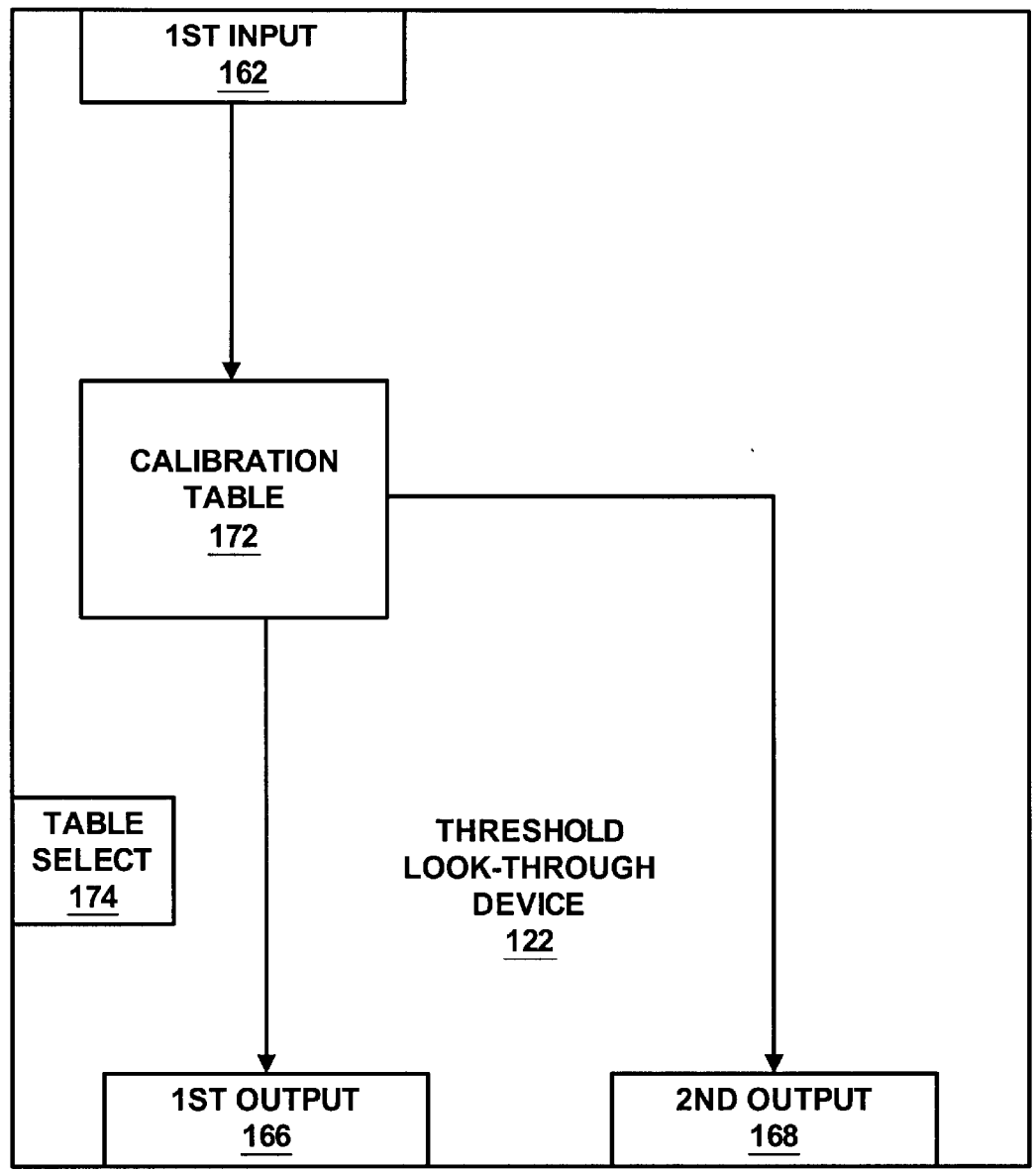
FIG. 4 is a block diagram further illustrating the threshold look-through table located within the correction application specific integrated circuit of FIG. 3.

As shown by FIG. 4, the threshold look-through device 122 contains an input 162, a first output 166 and a second output 168. The threshold look-through device 122 also contains a calibration table 172 for storing code words received from the local memory 114 (FIG. 1) and associated threshold, values. A series of calibration tables may be located within the threshold look-through device 122, where different calibration tables are used for different sets of operating conditions. If a series of calibration tables are located within the threshold look-through device 122, a table select 174 may also be located within the threshold look-through device 122 for selecting from the series of calibration tables. If indeed a series of calibration tables are located within the threshold look-through device 122, the input 162 and the second input 164 are both connected to each calibration table within the series.

As mentioned above, the calibration table 172 stores calibration values for a particular device located within the digital oscilloscope 102, such as, particular to the present description, thresholds and code words of the ADC 108 (FIG. 2). Specifically, the calibration table 172 has stored therein, code words and low and high threshold values determined for each of the code words. It should be noted that it might not be necessary to store both the low and high thresholds. Instead, code words and high threshold values may exclusively be stored within the calibration table 172. Threshold storage is further discussed below.

In accordance with the first exemplary embodiment of the invention, each code word stored within the calibration table 172 has an associated low threshold and a high threshold also stored within the calibration table 172. The low threshold for a first stored code word within the calibration table 172 is the high threshold for a second stored code word that is equal to the first stored code word minus 1. The high threshold for the same first stored code word is equal to the low threshold for a third stored code word that is equal to the first stored code word plus 1. In accordance with the first exemplary embodiment of the invention, a best representation of code word "43" is a value half-way between the two thresholds for code word "43" (i.e., (low threshold+high threshold)/2). It should be noted that a best representation is a representation that statistically minimizes root mean square (rms) error.

Returning to FIG. 3, to perform non-linearity correction, code words stored within the local memory 114 are fed into the correction ASIC 120. The fed code words may be different sizes such as, but not limited to, eight (8) bits or sixteen (16) bits in length. In accordance with the first exemplary embodiment of the invention, the fed code words are eight (8) bits in length.

The correction ASIC 120 may function in multiple modes, one of which may be selected by a user of the digital oscilloscope 102 (FIG. 2) via the input devices 124 (FIG. 2). In a first mode, referred to as a normal mode, a single code word is fed into the correction ASIC 120.

Alternatively, in a second mode, referred to as a high-resolution mode, multiple code words are averaged by the processor 112 (FIG. 2). Specifically, multiple code words are added together and the sum of the code words is divided by the number of code words added, thereby resulting in an averaged code word. The averaged code word has a unitary portion, which is a whole number portion of the averaged code word, and a fractional portion. As an example, if ten (10) code words, were added, wherein three code words are fours (4), six code words are fives (5) and one code word is a six (6), the averaged code word would be forty 48 (48) divided by ten (10), or 4.8. Therefore, the unitary portion is 4 and the fractional portion is 8. The addition of noise, as is described below, ensures a uniform resolution of displayed code words.

The high-resolution mode utilizes a lower bandwidth than is used in normal mode, yet contains a higher voltage resolution. High-resolution mode results in finer resolution of the signal and less noise that normal mode, but also utilizes less bandwidth than is used in normal mode. If a signal analyzed by the user does not have high frequency content, the user does not have a disadvantage associated with use of high-resolution mode and the user can observe fine details of the signal. In addition, if the user uses high-resolution mode with a high frequency signal, high frequency details of the signal may be lost, such as, for example, rise times, overshoot and ringing.

The averaged code word is then fed into the correction ASIC 120. It should be noted that averaging of the code words may be performed by alternative circuitry located within the correction ASIC 120, or by the ADC 108 (FIG. 2). Normal mode and high-resolution mode are further described below.

A pseudo-random binary sequence (PRBS) generator 138 generates pseudo-random noise. The pseudo-random noise is an eight bit random number that is further processed and amended to the averaged code word as a portion of the pseudo-random noise. The portion of the pseudo-random noise is added to the fractional portion of the averaged code word. As an example, if the averaged code word was five (5) and the pseudo-random noise value was nine (9), the resulting code word would be 5 plus 9/256, or 5.0352, wherein 256 is the maximum value of an eight bit random number.

In accordance with the first exemplary embodiment of the invention, the PRBS generator 138 is a thirty-two-bit random number generator. Of course, the PRBS generator 138 may be a higher or lower bit random number generator. Eight bits of a randomly generated thirty-two-bit number generated by the PRBS generator 138 are used as pseudo-random noise. It should be noted that the PRBS generator 138 is programmable so that the amount of noise provided by the PRBS generator 138 can be decreased. However, in accordance with alternative embodiments of the invention, it may be possible to increase and decrease the amount of noise provided by the PRBS generator 138. Since the pseudo-random noise is eight bits in length, the noise may randomly vary in value from 0/256 to 255/256.

In normal mode, the read pipe scaling register 134 provides a value of one to be multiplied by a single code word that is provided to the correction ASIC 120. In addition, the full range of noise from the PRBS generator 138 is added to the single code word in normal mode. Alternatively, in high-resolution mode, a portion of the pseudo-random noise provided by the PRBS generator 138 is added to the summed code word. Determination of the size of the portion of the pseudo-random noise is described below.

A noise scaling register (NSR) 142 is provided within the correction ASIC 120 for scaling noise provided by the PRBS generator 138 when the correction ASIC 120 is in high-resolution mode. The processor 112 (FIG. 2) located within the digital oscilloscope 102 (FIG.2), sets the noise scaling register 142 to a numerical value that, when multiplied with noise provided by the PRBS generator 138, decreases the amount of noise that is added to the averaged code word. Multiplication of the noise provided by the PRBS generator 138 with the numerical value from the noise scaling register 142 is provided by a first multiplication module 144. The result after multiplication is a uniform noise source having an adjustable amplitude.

During normal mode, the processor 112 (FIG. 2) sets the noise scaling register 142 to provide a numerical value of one that is multiplied by the pseudo-random noise provided by the PRBS generator 138. By multiplying the pseudo-random noise by one, all noise is added to the single code word. Alternatively, in high-resolution mode, the processor 112 (FIG. 2) sets the noise scaling register 142 to a numerical value of 1/N, where N is the number of code words averaged. In either the normal mode or the high-resolution mode, the numerical value of the noise scaling register 142 is multiplied by the pseudo-random noise provided by the PRBS generator 138.

A bias register 146 is also located within the correction ASIC 120. The processor 112 (FIG. 2) sets the bias register 146 to hold a value that, when combined with random noise from the PRBS generator 138 scaled by the noise scaling register 142, results in a total bias of 0.5. Combination of the value from the bias register 146 with the random noise from the PRBS generator 138 scaled by the noise scaling register 142 is provided by a second addition module 148. As is further described below, it is desirable to have a total bias of 0.5 so that a sum of threshold values outputted by the threshold look-through device 122 may be averaged. Averaging the sum of the outputted threshold values provides a linear interpolation of the output threshold values.

The result after combination by the second addition module 148 is the portion of the pseudo-random noise that is added to the fractional portion of the averaged code word by the first addition module 136. Therefore, after addition by the first addition module 136, the resulting code word still comprises a unitary portion and a fractional portion. The unitary portion of the resulting code word, which is a whole number, is received by the input 162 (FIG. 4) of the threshold look-through device 122. The unitary portion of the resulting code word is then searched within the calibration table 172 (FIG. 4). The high threshold and the low threshold assigned to the searched unitary portion of the resulting code word are outputted from the threshold look-through device 122, wherein the high threshold is outputted via the first output 166 (FIG. 4) of the threshold look-through device 122 and the low threshold is outputted via the second output 168 (FIG. 4) of the threshold look-through device 122. It should be noted that the processor 112 (FIG. 2) may perform the search and outputting of the high threshold and the low threshold. Alternatively, the threshold look-through device 122 may comprise logic that automatically outputs the high threshold and the low threshold when the unitary portion is received by the threshold look-through device 122.

The low threshold is then subtracted from the high threshold by a first subtraction module 154, resulting in a threshold portion. A second multiplication module 156 multiplies the threshold portion by the fractional portion of the averaged code word received from the first addition module 136. As previously stated, the fractional portion of the averaged code word is preferably an average of 0.5. The result after multiplication by the second multiplication module 156 is added by a third addition module 158 to the result outputted from the first output 166 (FIG. 4) of the threshold look-through device 122. The result after addition by the third addition module 158 is linear digital data having a uniform resolution that may be displayed by the digital oscilloscope 102 (FIG. 2). The final result is the linear interpolation between the two thresholds by the fractional portion.

Figure 5:
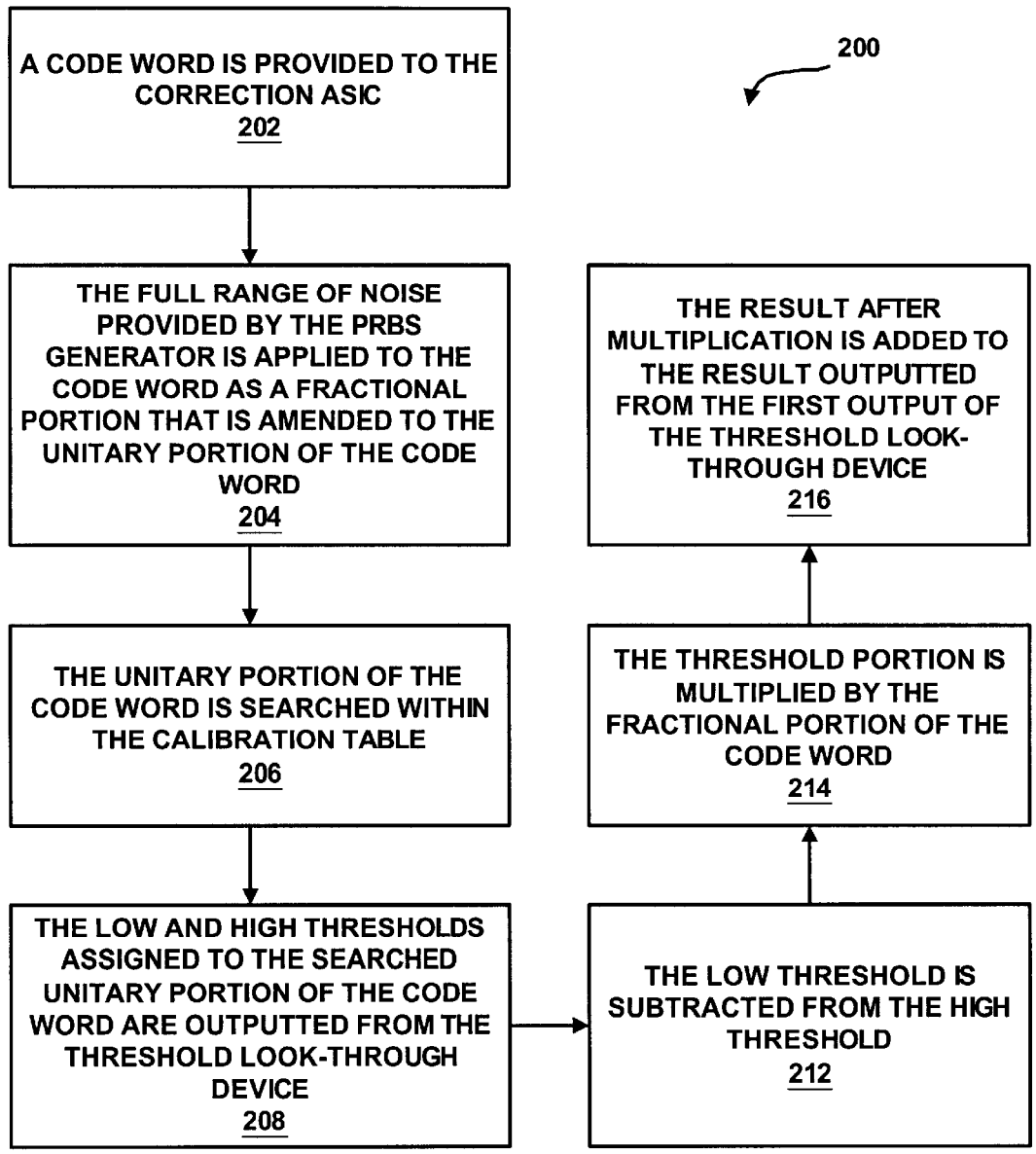
FIG. 5 is a flowchart illustrating functions performed by the correction application specific integrated circuit of FIG. 3 during normal mode.

FIG. 5 is a flowchart 200 illustrating functions performed by the correction ASIC 120 of FIG. 3 during normal mode. Any process descriptions or blocks in flowcharts should be understood as representing modules, segments, or portions of code that include one or more executable instructions for implementing specific logical functions or steps in the process, and alternative implementations are included within the scope of the first exemplary embodiment of the invention in which functions may be executed out of order from that shown by figures or discussed herein, including substantially concurrently or in reverse order, depending on the functionality involved, as would be understood by those having ordinary skill in the art of the present invention.

As shown by block 202 when the correction ASIC 120 (FIG. 3) is functioning in normal mode, a code word outputted by the ADC 108 (FIG. 2) is provided to the correction ASIC 120 (FIG. 3). The full range of noise provided by the PRBS generator 138 (FIG. 3) is applied to the code word as a fractional portion that is amended to a unitary portion of the cord word (block 204).

The unitary portion of the code word is received by the input 162 (FIG. 4) of the threshold look-through device 122 (FIG. 4), after which the unitary portion of the code word is searched within the calibration table 172 (FIG. 4) (block 206). The low threshold and high threshold assigned to the searched unitary portion of the code word are outputted from the threshold look-through device 122 (FIG. 4) (block 208)

The low threshold is subtracted from the high threshold (block 212), resulting in a threshold portion. The threshold portion is multiplied by the fractional portion of the code word (block 214). The result after multiplication is added to the result outputted from the first output 166 (FIG. 4) of the threshold look-through device 122 (block 216). The result after addition is linear digital data having a uniform resolution that may be displayed by the digital oscilloscope 102 (FIG. 2).

Figure 6:
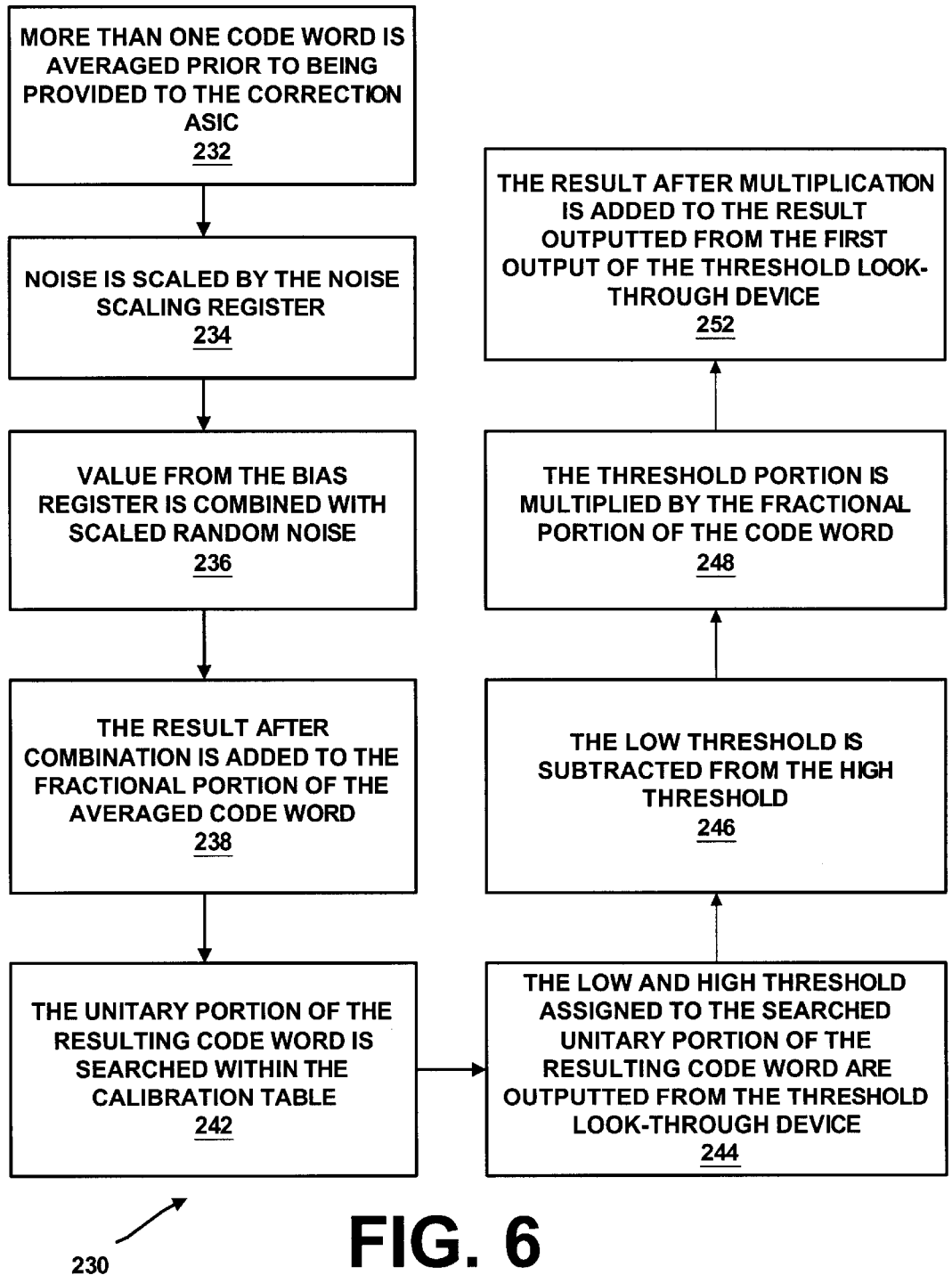
FIG. 6 is a flowchart illustrating functions performed by the correction application specific integrated circuit of FIG. 3 during high-resolution mode.

FIG. 6 is a flowchart 230 illustrating functions performed by the correction ASIC 120 of FIG. 3 during high-resolution mode. In high-resolution mode, more than one code word is averaged prior to being provided to the correction ASIC 120 (FIG. 3) (block 232) resulting in an averaged code word having a unitary portion and a fractional portion.

Noise provided by the PRBS generator 138 (FIG. 3) is scaled by the noise scaling register 142 (FIG. 3) (block 234). The bias register 146 (FIG. 3) provides a value, that when combined with random noise from the PRBS generator 138 (FIG. 3), scaled by the noise scaling register 142 (FIG. 3), results in a total bias of 0.5. The value from the bias register 146 (FIG. 3) is combined with the random noise from the PRBS generator 138 (FIG. 3) scaled by the noise scaling register 142 (FIG. 3) (block 236). The result after combination is added to the fractional portion of the averaged code word (block 238).

The unitary portion of the resulting code word is received by the input 162 (FIG. 4) of the threshold look-through device 122 (FIG. 4), after which the unitary portion of the resulting code word is searched within the calibration table 172 (FIG. 4) (block 242). The low threshold and high threshold assigned to the searched unitary portion of the resulting code word are outputted from the threshold look-through device 122 (FIG. 4) (block 244)

The low threshold is subtracted from the high threshold (block 246), resulting in a threshold portion. The threshold portion is multiplied by the fractional portion of the code word (block 248). The result after multiplication is added to the result outputted from the output 166 (FIG. 4) of the threshold look-through device 122 (block 252). The result after addition is linear digital data having a uniform resolution that may be displayed by the digital oscilloscope 102 (FIG. 2).

In accordance with a third exemplary embodiment of the invention, noise addition and interpolation may be performed even if linearity correction is not performed. In addition, in accordance with a fourth exemplary embodiment of the invention, during high-resolution mode, interpolation may be performed even if noise is not added and/or linearity is not corrected.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A system for improving linearity of data outputted from an analog-to-digital converter and reducing digitization artifacts, comprising:

a noise generator for generating noise and adding said noise to at least one code word that is introduced to said system, wherein said at least one code word comprises a unitary portion and a fractional portion, said noise being added to said fractional portion of said at least one code word; and a storage device for storing said at least one code word, and a high threshold and a low threshold for each said at least one code word, said storage device being capable of outputting said high threshold and said low threshold of said at least one code word as a result of receiving said unitary portion of said at least one code word, wherein said low threshold and said high threshold, in combination with said fractional portion, are utilized to derive linear digital data having a uniform resolution.

2. The system of claim 1, wherein said system is located on an application specific integrated circuit.

3. The system of claim 1, wherein said noise generator is a pseudo-random binary sequence (PRBS) generator.

4. The system of claim 1, wherein said system functions in a normal mode, said normal mode being further defined by said at least one code word being a single code word, said single code word being provided to said system and said noise being amended to said single code word.

5. The system of claim 1, wherein said system functions in a high-resolution mode, said high-resolution mode being further defined by said at least one code word being two or more code words, said two or more code words being averaged to derive an averaged code word, and a portion of said noise being added to said fractional portion of said averaged code word.

6. The system of claim 5, further comprising a noise scaling register, wherein said noise scaling register provides a numerical value of 1/N, where N is a number of code words that have been averaged, wherein multiplication of said numerical value of 1/N by said noise provides said portion of said noise.

7. The system of claim 1, further comprising an oscilloscope screen, wherein said linear digital data is displayed via said oscilloscope screen.

8. A method of improving linearity of data outputted from an analog-to-digital converter and reducing digitization artifacts, comprising the steps of:

averaging a series of code words outputted from said analog-to-digital converter, resulting in an averaged code word having a unitary portion and a fractional portion;

adding a noise portion to said fractional portion of said averaged code word;

determining a low threshold and a high threshold via use of said unitary portion of said averaged code word; and utilizing said low threshold and said high threshold, in combination with said fractional portion, to derive linear digital data having a uniform resolution.

9. The method of claim 8, wherein a result of utilizing said low threshold and said high threshold, in combination with said fractional portion, is a linear interpolation between said low threshold and said high threshold, by said fractional portion.

10. The method of claim 8, further comprising the step of displaying said linear digital data.

11. The method of claim 9, further comprising the step of displaying said linear digital data.

12. The method of claim 8, wherein said portion of noise is derived by performing the step of multiplying a numerical value of 1/N, where N is a number of code words that have been averaged, by a full amount of noise.

13. The method of claim 8, further comprising the step of providing linear interpolation of said high threshold and said low threshold of each code word within said series of code words.

14. A method of improving linearity of data outputted from an analog-to-digital converter and reducing digitization artifacts, comprising the steps of:

adding noise to a code word outputted from said analog-to-digital converter, wherein said code word comprises a unitary portion and a fractional portion, said noise being added to said fractional portion of said code word;

determining a low threshold and a high threshold via use of said unitary portion of said code word; and utilizing said low threshold and said high threshold, in combination with said fractional portion, to derive linear digital data having a uniform resolution.

15. The method of claim 14, wherein a result of utilizing said low threshold and said high threshold, in combination with said fractional portion, is a linear interpolation between said low threshold and said high threshold, by said fractional portion.

16. The method of claim 14, further comprising the step of displaying said digital data.

17. A system for improving linearity of data outputted from an analog-to-digital converter and reducing digitization artifacts, comprising:

means for adding a noise to at least one code word that is introduced to said system, wherein said at least one code word comprises a unitary portion and a fractional portion, said noise being added to said fractional portion of said at least one code word; and means for storing said at least one code word, and a high threshold and a low threshold for each said at least one code word, said means for storing being capable of outputting said high threshold and said low threshold of said at least one code word as a result of receiving said unitary portion of said at least one code word, wherein said low threshold and said high threshold, in combination with said fractional portion, are utilized to derive linear digital data having a uniform resolution.

18. The system of claim 17, wherein said system functions in a normal mode, said normal mode being further defined by said at least one code word being a single code word, said single code word being provided to said system and said means for amending, amending said noise to said single code word.

19. The system of claim 17, wherein said system functions in a high-resolution mode, said high-resolution mode being further defined by said at least one code word being two or more code words, said system further comprising:
   means for averaging said two or more code words to derive an averaged code word,
   wherein a portion of said noise is added to said fractional portion of said averaged code word.

20. The system of claim 17, further comprising:
   means for providing linear interpolation of said high threshold and said low threshold of each said at least one code word.

* * * * *